(12) United States Patent
Christoph

(10) Patent No.: US 8,788,554 B2
(45) Date of Patent: Jul. 22, 2014

(54) SUB-BAND ADAPTIVE FIR-FILTERING

(75) Inventor: Markus Christoph, Straubing (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 514 days.

(21) Appl. No.: 13/038,964

(22) Filed: Mar. 2, 2011

(65) Prior Publication Data

US 2011/0216807 A1 Sep. 8, 2011

(30) Foreign Application Priority Data

Mar. 2, 2010 (EP) .................................. 10155192

(51) Int. Cl.
*G06F 17/10* (2006.01)
(52) U.S. Cl.
USPC .......................................... 708/300; 708/301
(58) Field of Classification Search
None
See application file for complete search history.

(56) References Cited

U.S. PATENT DOCUMENTS

| | | | | |
|---|---|---|---|---|
| 5,553,014 | A * | 9/1996 | De Leon et al. | 708/322 |
| 5,610,909 | A * | 3/1997 | Shaw | 370/291 |
| 6,487,535 | B1 * | 11/2002 | Smyth et al. | 704/500 |
| 6,915,264 | B2 * | 7/2005 | Baumgarte | 704/500 |
| 2010/0146026 | A1 * | 6/2010 | Christoph | 708/313 |

OTHER PUBLICATIONS

Weiss et al., "Adaptive equalisation in oversampled subbands", Electronics Letters, IEE Stevenage, GB, vol. 34, No. 15, Jul. 1998, pp. 1452-1453.
Larson et al., "A new subband weight transform for delayless subrand adaptive filtering structures", Digital Signal Processing Workshop, 2002 and the 2nd Signal Processing Education Workshop, Oct. 2002, pp. 201-206.
Weiss et al., "Fast implementation of oversampled modulated filter banks", Electronics Letters, IEE Stevenage, GB, vol. 36, No. 17, Aug. 2000, pp. 1502-1503.

(Continued)

*Primary Examiner* — Michael D Yaary
(74) *Attorney, Agent, or Firm* — O'Shea Getz P.C.

(57) ABSTRACT

A method for designing a set of sub-band FIR filters, where each FIR filter has a number of filter coefficients and is connected to an adjustable delay line. The method includes dividing an input signal into a number of sub-band signals, where a spectrum of the input signal comprises spectra of the sub-band signals; providing a respective goal sub-band signal for each sub-band dependent on a goal signal; filtering and delaying each sub-band signal using a corresponding FIR filter and delay line to provide filtered signals; providing error signals for each sub-band dependent on the filtered signals and the corresponding goal signals; adapting the filter coefficients of each sub-band FIR filter such that the respective filtered signal approximately matches a corresponding goal sub-band signal; and changing a respective delay of the delay line for each sub-band to reduce or increase a first quality criterion.

14 Claims, 4 Drawing Sheets

(56) References Cited

OTHER PUBLICATIONS

Weiss et al., "On Adaptive Filtering in Oversampled Subbands", Shaker Verlag, Aachen, 1998, Chapter 4, pp. 63-101.
Blauert, "Spatial Hearing", MIT Press, 1983, Chapter 2.1, pp. 37-50.
Crockett et al., "Next Generation Automotive Research and Technologies", Convention Paper 6649, 120th AES Convention, Paris, FR, Mar. 20-23, 2006.
Sugiyama et al., "A New Adaptive Intersubband Tap-Assignment Algorithm for Subband Adaptive Filters", Proceedings of ICASSP, vol. 5, 1995, pp. 3051-3054.
DeBrunner et al., "Sub-Band Adaptive Filtering with Delay Compensation for Active Control", IEEE Transactions on Signal Processing, IEEE Service Center, vol. 52, No. 10, Oct. 2004, pp. 2932-2937.
Farhang-Boroujeny et al., "Adaptive Filtering in subbands: Design issues and experimental results for acoustic echo cancellation", Signal Processing, Elsevier Science Publishers, B.V. Amsterdam, NL, vol. 61, No. 3, Sep. 1997, pp. 213-223.

\* cited by examiner

SUB-BAND ADAPTIVE FIR-FILTERING

CLAIM OF PRIORITY

This patent application claims priority from EP Application No. 10 155 192.7 filed Mar. 2, 2010, which is hereby incorporated by reference.

FIELD OF TECHNOLOGY

The present invention relates generally to sub-band signal processing and, more particularly, to sub-band FIR filters for audio applications.

RELATED ART

A FIR filter (finite impulse response filter), in contrast to an IIR filter (infinite impulse response filter), may be configured as a digital filter having a transfer function (i.e., magnitude and phase response), which is arbitrarily definable. The transfer function therefore may be designed with minimum phase, maximum phase or mixed phase. Linear phase transfer functions may also be implemented, which is often desired in audio signal processing.

Filter lengths are typically relatively long when using FIR filters in audio signal processing. Increasing the length of a FIR filter, however, may also increase computational complexity and memory requirements during operation. Decay time of room impulse responses present in most audio applications, for example, is considerably long, which results in correspondingly long filter lengths when using FIR filters. In addition, the human auditory system provides a non-uniform frequency resolution over different frequency bands. The human auditory system resolves low frequencies quite well (e.g., frequency differences may be more easily recognized at low absolute frequencies), whereas high frequencies are not easily discerned. A 100 Hz tone may, for example, be easily distinguished from a 200 Hz tone, whereas the human ear has difficulties distinguishing a 5000 Hz tone from a 5100 Hz tone, although the frequency difference is 100 Hz in both cases. The frequency resolution of the human auditory system, therefore, typically decreases with increasing frequencies. This phenomenon is well known and forms the basis for psychoacoustical frequency scales adapted to the human auditory system such as the Bark scale, the Mel scale, and ERB (equivalent rectangular bandwidth) scale.

Research has shown that listening room impulse responses are considerably long, especially at low frequencies, because the degradation of energy is slow depending on the interior of the room (e.g., carpet, upholstered furniture, etc.). This effect is even intensified by the fact that the sound pressure generated by an audio reproduction system is higher in the bass frequency range (e.g., below 200 Hz), whereas the human auditory system is less sensitive to low frequency audio signals.

The length of a FIR filter is typically larger than a certain minimum length in order to provide sufficient audio quality in audio signal processing systems due to the aforesaid characteristics of the human auditory system and a typical listening room. A FIR filter with 4410 filter coefficients may be used, for example, for each audio channel at a sampling frequency of 44100 Hz to provide a frequency resolution of about 10 Hz in the bass frequency range, where modern audio systems have up to 16 channels.

There is a need for a FIR filter in audio applications that permits use of standard digital audio signal processing hardware and, thus, a need for adequate filter design methods.

SUMMARY OF THE INVENTION

According to an aspect of the invention, a method is provided for designing a set of sub-band FIR filters, where each FIR filter has a number of filter coefficients and is connected to an adjustable delay line. The method includes dividing an input signal into a number of sub-band signals, where a spectrum of the input signal includes spectra of the sub-band signals; providing a respective goal sub-band signal for each sub-band dependent on a goal signal; filtering and delaying each sub-band signal using a corresponding FIR filter and delay line to provide filtered signals; providing error signals for each sub-band dependent on the filtered signals and the corresponding goal signals; adapting the filter coefficients of each sub-band FIR filter such that the respective filtered signal approximately matches a corresponding goal sub-band signal; and changing a respective delay of the delay line for each sub-band to reduce or increase a first quality criterion.

According to another aspect of the invention, a method is provided for filtering an input signal with a set of sub-band FIR filters, where each FIR filter has a number of filter coefficients and is connected to an adjustable delay line. The method includes dividing the input signal into a number of sub-band signals, where a spectrum of the input signal includes spectra of the sub-band signals; providing a respective goal sub-band signal for each sub-band dependent on a goal signal; filtering and delaying each sub-band signal using a corresponding FIR filter and delay line to provide filtered signals; providing error signals for each sub-band dependent on the filtered signals and the corresponding goal signals; adapting the filter coefficients of each sub-band FIR filter such that the respective filtered signal approximately matches a corresponding goal sub-band signal; and changing a respective delay of the delay line for each sub-band to reduce or increase a first quality criterion.

DESCRIPTION OF THE DRAWINGS

Aspects of the invention may be better understood referring to the following drawings and descriptions. In the figures like reference numerals designate corresponding parts. In the drawings.

DETAILED DESCRIPTION OF THE INVENTION

Figure 1:
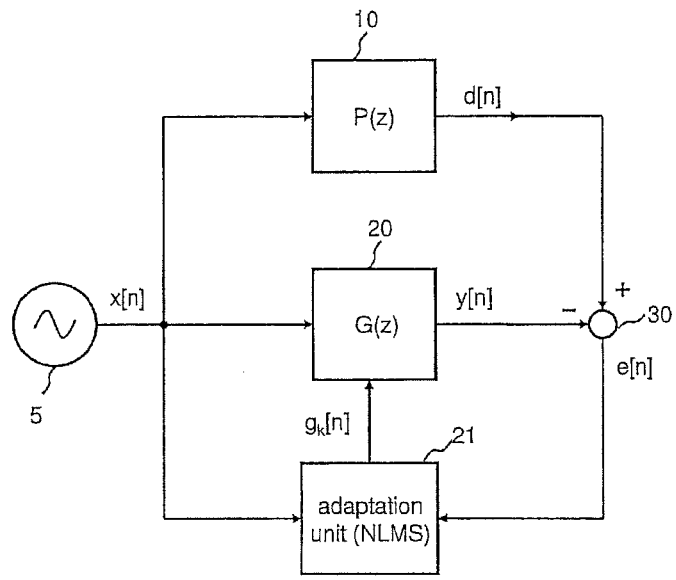
FIG. 1 illustrates a basic signal processing structure for an adaptive calculation of filter coefficients of a FIR filter, the FIR filter representing a transfer function $G(z)$ that approximately matches a predefined target function $P(z)$.

FIG. 1 illustrates a basic signal processing structure for an adaptive calculation of filter coefficients $g_k$ ($k=0, 1, \ldots, K-1$)

of a FIR filter 20. The subscript k represents an index of the filter coefficient, and the variable K represents a filter length. The FIR filter 20 has a (discrete) transfer function G(z) which, after successful adaptation of the filter coefficients $g_k$, approximately matches a predefined target function P(z) of a reference system 10. The reference filter 10 and the FIR filter 20 are supplied with a test signal x[n] (e.g., an input/reference signal), which, for example, is white noise or any other signal having a band-width that includes the pass band of the target transfer function P(z). An output signal y[n] of the FIR filter 20 is subtracted via a subtractor 30 from the output signal d[n] (e.g., a desired goal signal) of the reference system 10. The difference d[n]−y[n] provides an error signal e[n] to an adaptation unit 21. The adaptation unit 21 calculates an updated set of FIR filter coefficients $g_k$ from the error signal e[n] and the input signal x[n] during each sample time interval. A Least-Mean-Square (LMS) algorithm or a Normalized-Least-Mean-Square (NLMS) algorithm may be employed for adaptation of the filter coefficients. Alternative adaptation algorithms, however, may also be utilized for this purpose. The FIR filter coefficients $g_k$ may represent a substantially improved (e.g., optimum) approximation of the target transfer function P(z) after, for example, a convergence of the adaptation algorithm.

A spectrum of a signal to be filtered may be divided into a number of narrow band signals (sub-band signals). Each narrow band signal may be separately filtered to reduce the computational effort (computational complexity) of the FIR filter. The division of a full-band signal into a plurality of sub-band signals may be implemented with an analysis filter bank (AFB). The sub-band signals may be combined (e.g., recombined) to a single full-band signal with a corresponding synthesis filter bank (SFB). Signals expressed herein without subscripts (e.g., the goal signal d[n], where n represents a time index) represent full band signals. Signals expressed herein with subscripts (e.g., $d_m[n]$) represent a set of sub-band signals which are the decomposition of the corresponding full-band signal d[n]. The subscript m represents the number of the sub-band (m=1, 2, . . . , M). Similarly, a discrete full-band transfer function G(z) may be decomposed into a number of sub-band transfer functions $G_m(z)$.

Figure 2:
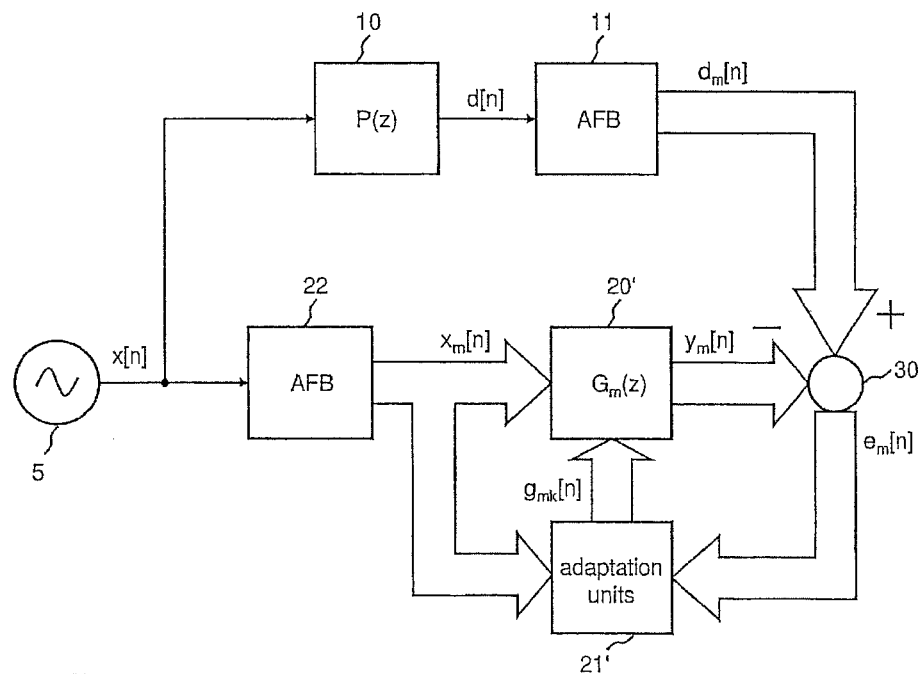
FIG. 2 illustrates a modification of the structure of FIG. 1 whereby the full-band FIR filter $G(z)$ of FIG. 1 is replaced by a set of sub-band FIR filters $G_m(z)$.
Figure 4:
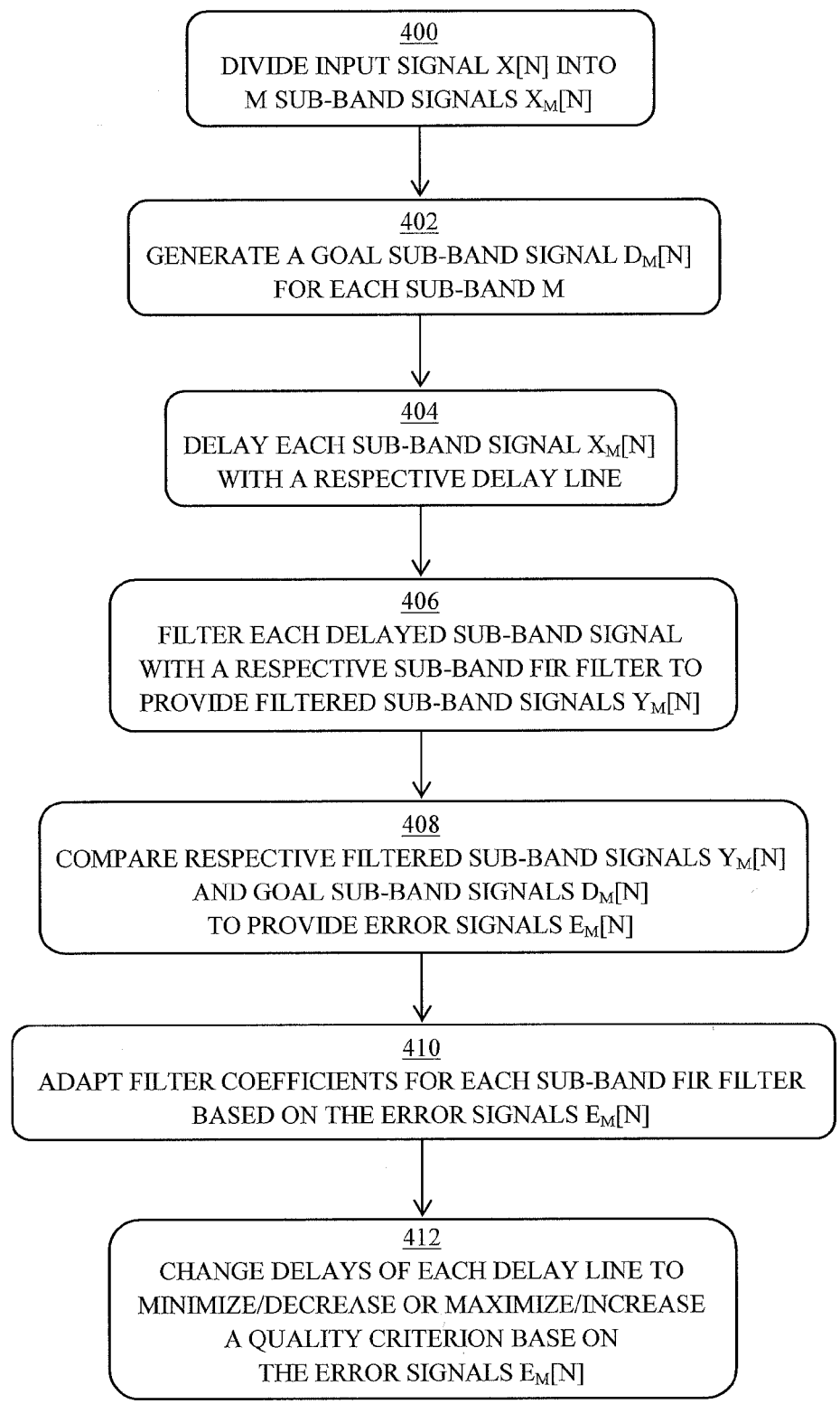
FIG. 4 illustrates a flow diagram of a method for designing a set of sub-band FIR filters.

FIG. 2 illustrates a basic signal processing structure similar to that in FIG. 1, whereby the adaptive FIR filter 20 is replaced by a set 20' of sub-band FIR filters. FIG. 4 illustrates a flow diagram of a method for designing a set of sub-band FIR filters. Referring to FIGS. 2 and 4, in step 400, the full-band input signal x[n] is divided into M number of sub-band input signals $x_m[n]$ (with m=1, 2, . . . , M) with an AFB 22 (FIG. 2). In step 402, the full-band goal signal d[n] is divided into M number of goal sub-band signals $d_m[n]$ using an AFB 11 (again m=1, 2, . . . , M). Each sub-band FIR filter has a narrow-band transfer function $G_m(z)$, where the subscript m represents the number of the sub-bands. Each sub-band FIR filter $G_m(z)$ may be represented by its filter coefficients $g_{mk}$, where the subscript k represents the index of the filter coefficients ranging from k=0 to k=$K_m$−1 ($K_m$ being the filter length of the filter $G_m(z)$ in the $m^{th}$ sub-band). Each sub-band FIR filter $G_m(z)$ is associated with an adaptation unit (the set of adaptation units is denoted by numeral 21' in FIG. 2), which receives the corresponding error signal $e_m[n]=d_m[n]-y_m[n]$, and calculates a respective set of updated filter coefficients $g_{mk}$ (k=1, 2, . . . , $K_m$−1) for the respective sub-band m.

The filter coefficients $g_{mk}$ of each one of the M sub-band FIR filters $G_m(z)$ are adapted such that, after convergence of the adaptation algorithm, the overall transfer characteristic G(z) from a combination of all sub-band transfer functions $G_m(z)$ substantially matches the predefined target function P(z).

Figure 3:
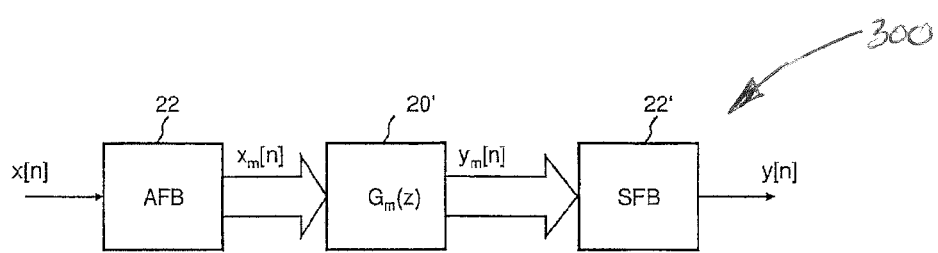
FIG. 3 illustrates a signal processing structure comprising a set of sub-band FIR filters $G_m(z)$ which can replace a full-band FIR filter $G(z)$.

FIG. 3 is a schematic illustration of a signal processor 300 that includes a set of sub-band FIR filters $G_m(z)$ 20', which may replace the full-band FIR filter G(z) shown in FIG. 1. The set of sub-band FIR filters $G_m(z)$ 20' may be operated between an analysis filter bank 22 and a corresponding synthesis filter bank 22' to filter audio signals, after calculating appropriate filter coefficients $g_{mk}$. The AFB 22, the FIR filter bank 20', and the SFB 22' together implement the transfer function G(Z) that approximately matches a target function P(z). The target function P(z) may represent, for example, an equalizing filter in an audio system. Both signal magnitude and signal phase may be subjected to equalization in an audio system to generate a desired sound impression for a listener. The target function P(z) therefore generally represents a non minimum phase filter with a non linear phase characteristic.

Computational efficiency (e.g., in terms of computational effort and memory requirements) of the signal processor 300 may depend on, inter alia, availability of efficient implementations of the analysis and synthesis filter banks. A filter bank where the band widths of the sub-bands with low center frequencies is narrower than the band widths of sub-bands with higher center frequencies may be used to account for the non-uniform frequency resolution of the human auditory system. A psycho-acoustically motivated division of full-band signals into a set of sub-band signals whose bandwidths depend on the position of the respective sub-band within the audible frequency range may be performed using a plurality of different approaches. No efficient filter bank is known, however, that non-uniformly divides an input spectrum into a set of sub-bands of different band-widths. Nevertheless, other methods are known in the art that allow for division of full-band signals into a set of sub-band signals of equal band-width. One example is the fast implementation of over-sampled GDFT filter banks as disclosed by S. Weiss et al. (see S. Weiss, R. W. Stewart, "*Fast Implementation of Over-sampled Modulated Filter Banks*", in: *IEE Electronics Letters*, vol. 36, pp. 1502-1503, 2000), which uses a prototype filter and the FFT algorithm which is available in many signal processing environments.

A filter bank is used that operates with sub-bands of sub-stantially equal band widths, as efficient implementations are not available for handling sub-bands of non-uniform band-width. FIR filters assigned to respective sub-bands may be chosen with different filter lengths, however, to reduce or alleviate the insufficiency of equally wide sub-bands. The FIR filters therefore may include a relatively small number of filter coefficients in sub-bands that use low frequency resolution, and a relatively large number of filter coefficients in sub-bands that use high frequency resolution. The sub-bands that use high frequency resolution are usually those sub-bands that lie in the lower part of the audible frequency range. A frequency resolution that corresponds to the frequency resolution of the human auditory system therefore may be provided using efficient filter banks operating with equally wide sub-bands.

Figure 5:
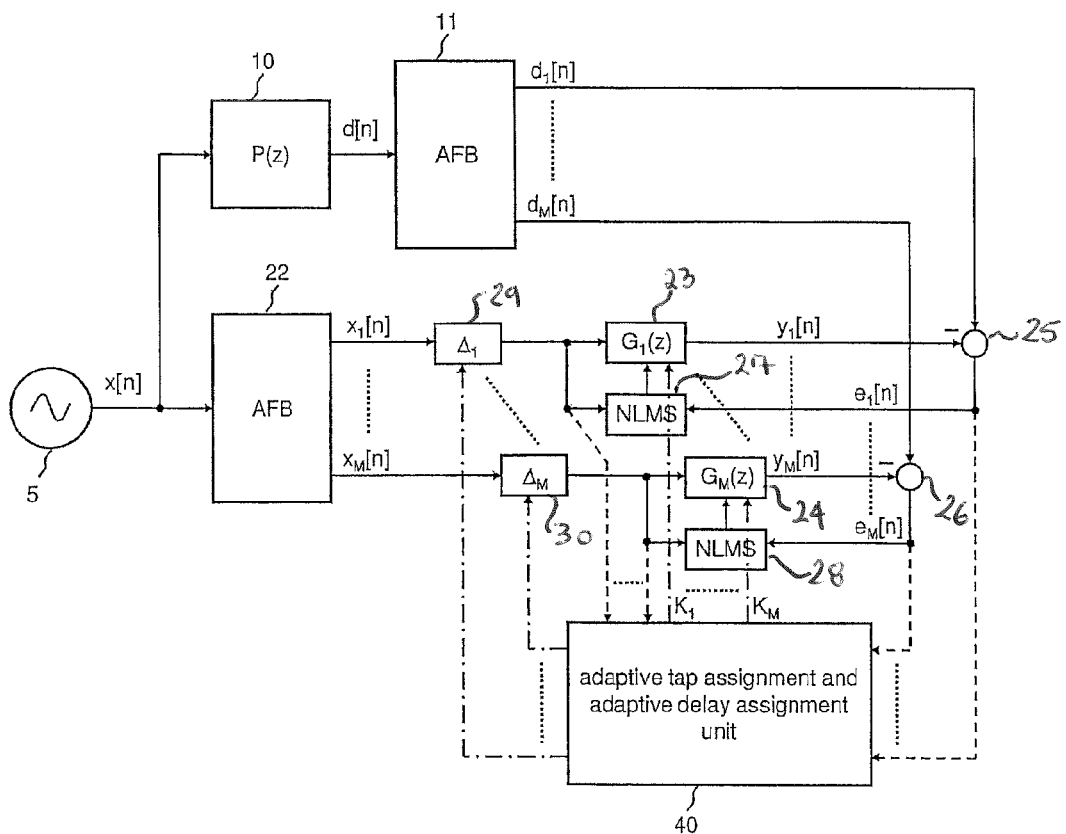
FIG. 5 illustrates a signal processing structure for adaptive FIR filter design including a number of sub-bands each comprising a sub-band FIR filter and a delay line.

The target function P(z), as indicated above, may be implemented via a non minimum phase filter having a non-linear group-delay characteristic over frequency. A delay line may be connected upstream or downstream to each sub-band FIR filter to compensate for different signal propagation delays due to different group delays in different sub-bands. The delay equalization therefore does not need to be provided using additional FIR filter coefficients, which are computationally inefficient. The number of filter coefficients (i.e.

number of filter "taps") and the delay values may be adaptively determined for each sub-band as described herein below as "Adaptive Tap Assignment" and "Adaptive Delay Assignment" algorithms because the delay values and the number of filter coefficients depend on the target transfer function P(z) (i.e. magnitude and phase response) to be realized. The filter coefficients (e.g., the coefficients $g_{mk}$ in FIG. 1) and the number $K_M$ of coefficients and an additional delay $\Delta_m$ therefore is adaptively determined when designing the M sub-band FIR filters $G_m(z)$. FIG. 5 is a schematic illustration of a signal processor 500 for implementing a sub-band FIR filter. The signal processor 500 in FIG. 5 is an enhanced version of the signal processor 200 in FIG. 2 with additional delays in each sub-band signal path and a global "adaptive tap assignment and delay assignment unit".

Referring to FIGS. 2 and 4, the full-band input signal x[n] (e.g., band-limited white noise) is supplied to the system 10 with the target transfer function P(z) to generate the goal signal d[n]. In steps 400 and 402, the goal signal d[n], as well as the input signal x[n], are divided into a number M of sub-band signals $d_m[n]$ and $x_m[n]$, respectively. The example of FIG. 5 illustrates the components and signals associated with the first and the last sub-band (i.e., m=1 and m=M). The sub-band input signals $x_m[n]$ are supplied to the adaptive FIR filters 23-24 with transfer function $G_m(z)$, thus generating filtered sub-band signals $y_m[n]$ (see step 406 in FIG. 4). Referring to FIGS. 4 and 5, in step 408, each filtered sub-band signals $y_m[n]$ is subtracted from the corresponding goal signal $d_m[n]$ via a respective subtractor 25, 26, yielding an error signal $e_m[n]$ for each sub-band. In step 410, an adaptation unit 27, 28 is assigned to each FIR filter $G_m(z)$ 23, 24 for optimizing the filter coefficients $g_{mk}$ (i.e., the impulse response $\{g_{m0}, g_{m1}, \ldots, g_{m(K-1)}\}$ of the filter) of the respective FIR filter $G_m(z)$, where the optimum set of filter coefficients $g_{mk}$ reduces (e.g., minimizes) a norm (e.g., the power) of the respective error signal $e_m[n]$.

A delay line 29, 30 providing a delay $\Delta_m$ (see step 404 in FIG. 4) is connected upstream or downstream to each sub-band FIR filter $G_m(z)$ 23, 24. In step 412, an "adaptive tap assignment and adaptive delay assignment unit" 40 is provided to dynamically adapt the filter lengths $K_m$ of the FIR filters $G_m(k)$ 23 and 24 and the corresponding delay values of the delay lines $\Delta_m$ 29, 30 in accordance with an adaptive tap assignment and adaptive delay assignment algorithm, which will be described below in further detail.

The above-mentioned adaptive tap assignment (i.e., the adaptation of FIR filter lengths) may be performed using a plurality of different approaches. One approach is to vary the filter lengths $K_m$ of the sub-band FIR filters $G_m(z)$ until the total error signal e[n] (whereby e[n]=$e_1$[n]+$e_2$[n]+...+$e_M$[n]) is reduced, for example, to a relative low (or minimum) value. Such a method yields good results, but may be time-consuming because the adaptive filters need time to converge after each change in the number of filter coefficients. Another approach which may also yield good results, but is less time-consuming, considers the energy of the S endmost filter coefficients $g_{m(Km-1)}, g_{m(Km-2)}, \ldots, g_{m(Km-S)}$. The filter length $K_m$ of a sub-band filter $G_m(z)$ is changed until the energy of the S endmost filter coefficients is approximately equal. This approach uses impulse response of the sub-band filter to decay exponentially over time, which is typical in real-world systems. An assessment of how well the sub-band filters $G_m(z)$ approximate the target function P(z) and provision of a rule for re-distributing filter coefficients across the sub-band filters may be provided by comparing the energies of the S endmost filter taps of each sub-band filter. Sub-band filter impulse responses therefore may be provided whose signal decay behavior is like the signal decay behavior of the impulse response of the target function P(z), which may be regarded as an optimum regarding minimized errors.

Examples of some adaptive tap assignment algorithms are described below in further detail. M/2 sub-bands may have to be processed for real-valued full-band input signals x[n] (see FIG. 2) because the other M/2 sub-band signals are conjugate complex copies of the signals in the first M/2 sub-bands. The respective sub-band FIR filter transfer functions therefore may obey, for example, the following relationship:

$$G_m(z) = G_{M-m+1}(z)^*, \text{ for } m=1, \ldots M/2, \quad (1)$$

where the asterisk represents a complex conjugate operator.

The filter lengths $K_m$ of the sub-band filters $G_m(z)$ (where m=1, 2, ..., M/2) are modified with a period of Q samples (i.e., samples in the sub-bad systems). The total number of filter coefficients $g_{mk}[n]$ of each sub-band filter $G_m(z)$, however, may remain constant. The filter length of another sub-band filter therefore is reduced such that the total number of filter coefficients are constant when the filter length of one or more sub-band filters increases. The length of each of the M/2 sub-band FIR filters may be reduced by $\Delta K$ coefficients for a period of Q samples. Thus, there are $\Delta K \cdot M/2$ "free" coefficients, which are re-distributed throughout the M sub-band filters according to certain criteria, which will be described below in further detail.

The aforesaid "re-distribution" may be expressed, for example, by the following equation:

$$K_m\left[\frac{n}{Q}+1\right] = K_m\left[\frac{n}{Q}\right] - \Delta K + \Delta K \cdot \frac{M}{2} \cdot \frac{c_m\left[\frac{n}{Q}\right]}{\sum_{i=1}^{M/2} c_i\left[\frac{n}{Q}\right]}, \quad (2)$$

where m=1, 2, ..., M/2 represents the number of the sub-band. The expression $c_m[n/Q]$ represents the above-mentioned criterion for the distribution of filter taps (i.e., filter coefficients). A useful criterion is the energy of the sub-band error signal $e_m[n]$. This criterion $c_m[n/Q]$ may be expressed, for example, by the following equation:

$$c_m\left[\frac{n}{Q}\right] = \frac{1}{R} \sum_{r=0}^{R-1} e_m[n-r] \cdot e_m^*[n-r], \quad (3)$$

where m=1, 2, ..., M/2, and R is the number of samples over which the error signal is averaged. The adaptive sub-band FIR filter converges before equation (3) is evaluated. R therefore is substantially smaller than Q; i.e., R<<Q. Another criterion considers the energy of the endmost S filter coefficients of the respective sub-band FIR filter. This criterion $c_m[n/Q]$ may be expressed, for example, by the following equation:

$$c_m\left[\frac{n}{Q}\right] = \frac{1}{S} \sum_{s=0}^{S-1} g_{m(Km-s)}[n] \cdot g_{m(Km-s)}^*[n], \quad (4)$$

where m=1, 2, ..., M/2, and $K_m$ represents the current filter lengths $K_m[n]$ in the respective sub-bands. Alternatively, the energy of the sub-band input signals $x_m[n]$ may be considered together with the endmost S filter coefficients. This criterion $c_m[n/Q]$ may be expressed, for example, by the following equation:

$$c_m\left[\frac{n}{Q}\right] = \frac{1}{R}\sum_{r=0}^{R-1} x_m[n-r] \cdot x_m^*[n-r] + \frac{1}{S}\sum_{s=0}^{S-1} g_{m(Km-s)}[n] \cdot g_{m(Km-s)}^*[n]. \quad (5)$$

The criterion according to equation (3), as indicated above, provides good results, but is time-consuming to evaluate. The criterion according to equation (5) should be used when the target system is time-varying and the input signals are arbitrarily colored, as may be the case in AEC (acoustic echo canceling) systems. For sub-band FIR filter design, equation (4) yields good quality results and also rapidly adapts where the input signal x[n], for example, may be chosen by the designer to be white noise.

Figure 6:
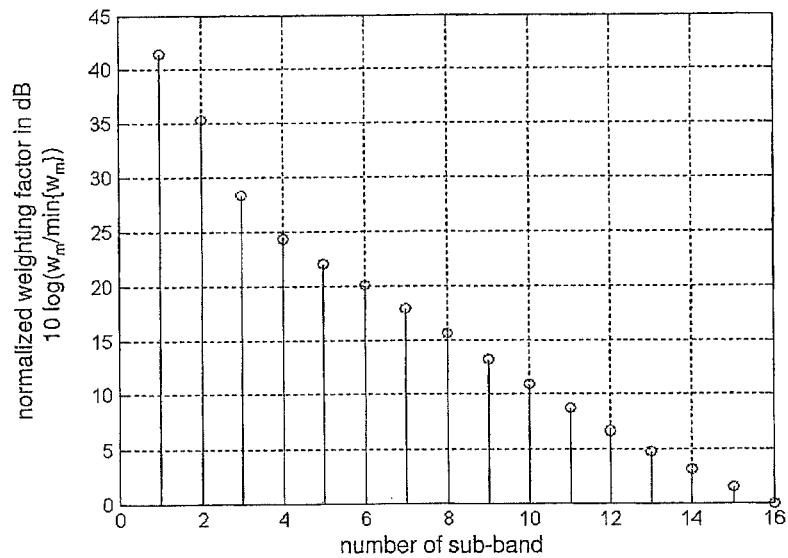
FIG. 6 graphically illustrates a set of Bark scale based weighting factors that emphasize low frequency sub-bands when adapting lengths of the sub-band FIR filters.

The expression $c_m$ as defined in equation (3), (4), or (5) may be weighted with a corresponding weighting factor $w_m$ to account for psycho-acoustic aspects; e.g., the expression $c_m[n/Q]$ may be replaced by $w_m \cdot c_m[n/Q]$ in equation (3), (4), or (5). The weighting factors $w_m$ may be chosen such that the frequency resolution of the human auditory system is considered. Using the Bark scale, the factors $w_m$ may be calculated, for example, with the following expression:

$$w_m = 13\tan^{-1}\left(0.76\frac{f_{c,m}+1}{1000}\right) + 3.5\tan^{-1}\left(\left(\frac{f_{c,m}+1}{7500}\right)^2\right) - \quad (6)$$
$$13\tan^{-1}\left(0.76\frac{f_{c,m}}{1000}\right) - 3.5\tan^{-1}\left(\left(\frac{f_{c,m}}{7500}\right)^2\right),$$

where $f_{c,m}$ represents the center frequency in Hertz (Hz) of the $m^{th}$ sub-band which may be calculated as $f_{c,m}=(2m-1)\cdot f_S/(2\cdot M)$, and $f_S$ represents the sampling frequency in Hz. An example set of normalized weighting factors $w_m$ that were calculated in accordance with equation (6) are illustrated in FIG. 6, where 16 sub-bands were considered (M/2=16).

The re-distribution of coefficients in accordance with equation (2), as indicated above, "equalize" either (i) the energy of the sub-band error signals $e_m[n]$ (see eqn. (3)), (ii) the energy of a part (e.g., the endmost S filter coefficients) of the sub-band filter-coefficients $g_{mk}$ (where k={$K_m$-S, ..., $K_m$-1}, see eqn. (4)), or (iii) a combination of energies of the sub-band filter-coefficients $g_{mk}$ and the sub-band input signals $x_m[n]$ (see eqn. (5)). Different energy-based criteria are possible. The "goal" of the algorithm is thus to provide an equal distribution of signal energies across the sub-bands. As this goal is the desired outcome of an optimization process, the above described algorithm may also be seen as a minimization (or maximization) operation.

In an ideal case, the criteria $c_m[n/Q]$ shown in equations (3) to (5) may have substantially equal values in each sub-band m where $$\frac{1}{\frac{M}{2}} = \frac{c_m\left[\frac{n}{Q}\right]}{\sum_{i=1}^{M/2} c_i\left[\frac{n}{Q}\right]}. \quad (7)$$

The criterion $c_m[n]$, therefore, is a factor 2/M smaller than the total value of $c_m[n]$ summed over all sub-bands in each one of the M/2 considered sub-bands. Returning to the above-mentioned minimization task, the quality function to be reduced (e.g., minimized) may be expressed as follows:

$$q_m = \left|\frac{c_m\left[\frac{n}{Q}\right]}{\sum_{i=1}^{M/2} c_i\left[\frac{n}{Q}\right]} - \frac{2}{M}\right|. \quad (8)$$

The FIR filters $G_m(z)$, as indicated above, generally have different group delays in different sub-bands, which provide different signal propagations delays. Each FIR filter is connected upstream or downstream to an adjustable delay line in each sub-band to compensate for such differing delays. The delay values in the sub-bands may be iteratively optimized, which will be described below as "adaptive delay assignment".

The FIR filter coefficients that are adaptively assigned to the FIR filters in the sub-bands (i.e., the adaptive tap assignment) may be considered infinite impulse responses truncated by multiplication with a rectangular window function that provides a finite impulse response. The rectangular window function may be shifted (e.g., along the time axis) for each sub-band FIR filter, where the respective time-shift represents the effective delay of the delay line connected to the corresponding FIR filter.

The adaptive delay assignment algorithm is targeted to find, for each sub-band, a delay value (i.e., a time-shift of the rectangular window) that results in a maximum energy finite impulse response of the respective FIR filter. Merely the energy or the corresponding FIR filter coefficients therefore are considered when assigning the delay values to the respective delay lines. Alternatively, the delay values may be chosen such that a norm of the total error signal $e[n]=e_1[n]+e_2[n]+\ldots+e_{M/2}[n]$ is reduced (e.g., minimized). As already mentioned with regard to the adaptive tap assignment algorithm, the use of such a criterion will result in a slow convergence, while still providing sufficiently good results. Alternatively, the delay values may be chosen such that the total energy of the respective FIR filter coefficients is increased (e.g., maximized).

Other criteria for finding optimum delay values may be targeted to equalize the energy of the causal and the acausal part of the respective impulse response since the FIR impulse responses (i.e., the FIR filter coefficients) of the sub-band filters generally include causal and acausal components due to the conversion into sub-bands. The difference between the energy of the first half and the energy of the second half of the respective sub-band FIR impulse response therefore is reduced (e.g., minimized). Such an optimizing strategy may be summarized as follows:

(i) Define a first part and a second part of the respective sub-band FIR impulse response $g_{mk}$, and calculate the energy of the first part and the second part of the FIR impulse response for each sub-band m.

(ii) Repeat the following steps with a period of V samples:
(A) Increase the delay of the respective delay line $\Delta_m$ by P taps (e.g. P=1) when the energy of the first part of the FIR impulse response $g_{mk}$ is greater than the energy of the second part of the impulse response.
(B) Decrease the delay of the respective delay line $\Delta_m$ by P taps (e.g. P=1) when the energy of the first part of the FIR impulse response $g_{mk}$ is lower than the energy of the second part of the impulse response. The minimum delay, however, is zero.

(C) Leave the delay unchanged when both energies are equal.

Dividing the FIR impulse response into two parts of equal lengths may provide good results for impulse responses whose maximum is located approximately in the middle of the impulse response. This optimizing strategy, however, may time shift the above-mentioned rectangular window to the right until the energy is equally distributed for a causal impulse response having its maximum at the left side, which inserts zeros on the left side of the impulse response. The results may be improved in practice therefore when the above mentioned first and second parts of the FIR impulse responses cover the upper and the lower margin of the respective impulse response (e.g., defined by a variable U, whereby 0<U<1), rather than the entire length of the respective impulse response1. Sixty percent of the filter coefficients may be considered, for example, when calculating the energy for U=0.6, where the lower thirty percent form the above-mentioned first part and the upper thirty percent form the corresponding second part. Thus, in the $m^{th}$ sub-band, the energies $E_{mL}$ and $E_{mU}$ of the first part and the second part may be expressed, for example, as follows:

$$E_{mU}[n] = \sum_{u=0}^{\lceil Km\frac{U}{2}\rceil} g_{m(Km-u)}[n] \cdot g_{m(Km-u)}^*[n], \quad (9)$$

$$E_{mL}[n] = \sum_{u=\lfloor(1-\frac{U}{2})Km\rfloor}^{Km} g_{m(Km-u)}[n] \cdot g_{m(Km-u)}^*[n]. \quad (10)$$

Thus, the delay value $\Delta_m$ is increased when $E_{mU}<E_{mL}$, the delay value $\Delta_m$ is decreased when $E_{mU}>E_{mL}$, and the delay value $\Delta_m$ is left unchanged when $E_{mU}=E_{mL}$. The delay value $\Delta_m$ therefore may be mathematically expressed as follows:

$$\Delta_m[n/V] = \begin{cases} \Delta_m[n/V-1] + P & \text{if } E_{mU} < E_{mL} \\ \max\{\Delta_m[n/V-1] - P, 0\} & \text{if } E_{mU} > E_{mL} \\ \Delta_m[n/V-1] & \text{if } E_{mU} = E_{mL}. \end{cases} \quad (10)$$

Generally, the adaptive delay assignment algorithm may be characterized as a minimization task, where the respective delay value $\Delta_m$ is varied in each sub-band until the quality criterion $c'_m[n/V]=|E_{mU}-E_{mL}|$ is reduced, for example, to a minimum, and where the index n/V indicates that the criterion is evaluated every $V^{th}$ sample time.

The filter impulse response (FIR filter coefficients) may be shifted to the left when respectively adjusting (e.g., increasing) the delay value $\Delta_m$ of a delay line in one sub-band by a number of taps, which maintains the total delay (including the delays of delay line and FIR filter) substantially constant. This avoids the need for a long re-adaptation of the FIR filter coefficients due to the variation of the delay value $\Delta_m$. The adaptation period with which the adaptive delay assignment and the adaptive tap assignment is performed, however, should be considerably longer than the adaptation step width of the LMS/NLMS algorithm. The adaptation of the FIR filter coefficients $g_{mk}$ therefore may be in a steady state when the adaptive tap assignment and adaptive delay assignment are initiated.

Although the adaptive adjustment of filter lengths and the adaptive adjustment of additional delays in each sub-band may be combined, both adaptation methods (i.e., the adaptive tap assignment and the adaptive delay assignment) may be used independently. The number of filter coefficients, for example, may be pre-defined for each sub-band (e.g., in accordance with the Bark scale) and the delays $\Delta_m$ may be adaptively adjusted as explained above. Further the adaptive determination of the filter lengths may be performed in accordance with the adaptive tap assignment method explained above without separate delay units, or with fixed and pre-defined delays. This may be especially appropriate in cases where the goal target function P(z) is a linear phase or a minimum phase transfer function.

The analysis filter bank and the corresponding synthesis filter banks (see, e.g., the filter banks 22 and 22' in FIG. 3), as indicated above, divide the real-valued full-band input signal x[n] into a set of complex-valued sub-band signals $x_m[n]$ and re-combine the complex-valued filtered sub-band signals $y_m[n]$ to a real-valued output signal y[n]. Other filter banks may be used, however, that only operate with real-valued sub-band signals. In this case, the sub-band FIR filters may be implemented more efficiently. The real-valued filter banks, however, require twice as many MACs (multiply-accumulate operations) as the corresponding complex-valued filter banks. The sub-bands may also be under-sampled by a factor M when using complex sub-band signals. The maximum under-sampling factor, in contrast, is M/2 when using real-valued filter banks. Finally, the required filter lengths of the sub-band FIR filters are half of the lengths when using real-valued sub-band signals. This indicates that the use of complex-valued AFBs and SFBs requires less computational effort than real-valued filter banks. Both types of filter banks, however, are applicable for the use in the present invention.

Figure 7A:
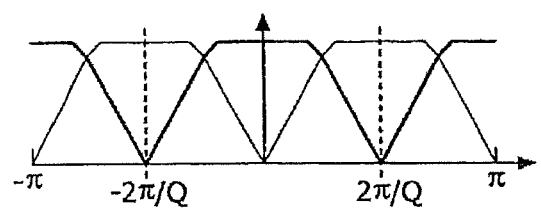
FIGS. 7A and 7B respectively illustrate a magnitude response of an evenly stacked filter bank, and a magnitude response of an oddly stacked filter bank.
Figure 7B:
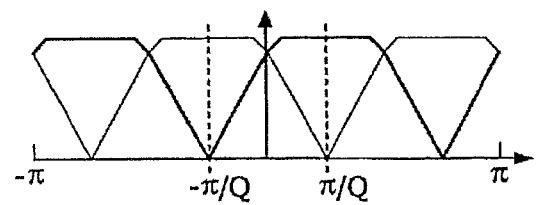

Evenly stacked or oddly stacked filter banks may be chosen when using complex-valued filter banks. Both types may be efficiently implemented using a generalized discrete Fourier transform algorithm (GDFT algorithm). FIGS. 7A and 7B illustrate the sub-bands of an evenly stacked filter bank (FIG. 7A) and an oddly stacked filter bank (FIG. 7B). It may be advantageous to use an oddly stacked GDFT filter bank because half of the M sub-bands are complex conjugate copies of the other half of the M sub-bands. Merely a number of M/2 complex-valued sub-band signals therefore are processed. When using an evenly stacked GDFT filter bank the lowest and the highest sub-bands are real-valued, but have half the band widths of the other sub-bands. A number of M/2+1 sub-band signals therefore are processed where the signals in the lowest sub-band are real-valued. Thus, the memory requirements are approximately half and the required MACs are approximately one quarter in the lowest sub-band, as compared to a complex-valued sub-band. Considering that the FIR filter ($G_1(z)$) of the lowest sub-band has the most filter coefficients $g_{1k}$ (when considering e.g. a frequency resolution according to Bark or any other psycho-acoustically adapted frequency scale), the overall efficiency improves by approximately twenty five percent in terms of memory required and by approximately fifty percent in terms of MACs required, although the total number of sub-bands to be processed increases from M/2 to M/2+1.

Although the present invention and its advantages have been described in detail, it should be understood that various changes, substitutions, and alterations may be made herein without departing from the spirit and scope of the invention as defined by the appended claims.

Moreover, the scope of the present application is not intended to be limited to the particular embodiments of the process, machine, manufacture, composition of matter, methods, and steps described in the specification. As one of ordinary skill in the art will readily appreciate from the disclosure of the present invention, processes, machines, manufacture, compositions of matter, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for designing a set of sub-band FIR filters, where each FIR filter has a number of filter coefficients and is connected to an adjustable delay line, the method comprising:
dividing an input signal into a number of sub-band signals, where a spectrum of the input signal comprises spectra of the sub-band signals;
providing a respective goal sub-band signal for each sub-band dependent on a goal signal;
filtering and delaying each sub-band signal using a corresponding FIR filter and delay line to provide filtered signals;
providing error signals for each sub-band dependent on the filtered signals and the corresponding goal signals;
adapting the filter coefficients of each sub-band FIR filter in response to the error signals; and
changing a respective delay of the delay line for each sub-band in response to the error signals.

2. The method of claim 1, where lengths of impulse responses of the sub-band FIR filters differ from each other in accordance with a psycho-acoustically motivated frequency scale.

3. The method of claim 2, where the psycho-acoustically motivated frequency scale comprises one of a Bark scale, a Mel scale and an ERB scale.

4. The method of claim 1, further comprising changing the number of filter coefficients of the respective FIR filter for each sub-band to increase or decrease a second quality criterion.

5. The method of claim 4, where the second quality criterion depends on at least one of energy of the sub-band error signal, energy of the sub-band input signal, and energy of the sub-band FIR filter coefficients.

6. The method of claim 5, where the second quality criterion depends on energy of a subset of consecutive filter coefficients including an end filter coefficient.

7. The method of claim 5, where the second quality criterion depends on the energy of the sub-band error signal given a number of consecutive samples of the respective error signal, which include a latest sample of the respective error signal.

8. The method of claim 4, where the second quality criterion is weighted in each sub-band by a weighting factor that represents a frequency resolution of a human auditory system.

9. The method of claim 1, where the first quality criterion depends on energy of the filter coefficients of the respective sub-band FIR filter for each sub-band.

10. The method of claim 9, further comprising:
defining a first sub-set of filter coefficients of the respective sub-band FIR filter for each sub-band;
defining a second sub-set of filter coefficients of the respective sub-band FIR filter for each sub-band; and
assuming a minimum for the first quality criterion when, in the respective sub-band, the energy of a first sub-set of filter coefficients substantially equals the energy of a second sub-set of filter coefficients.

11. The method of claim 1, further comprising:
calculating a norm of a sum of the error signals of each sub-band; and
assuming a minimum for the first quality criterion when the norm becomes minimal.

12. The method of claim 1, where the dividing of the input signal into the sub-band signals comprises filtering the input signal with an evenly stacked generalized discrete Fourier transform filter bank.

13. The method of claim 12, where the sub-band input signal and corresponding FIR filter coefficients are real-valued in lowest and highest sub-bands and complex-valued in other sub-bands.

14. A method for filtering an input signal with a set of sub-band filters, where each filter has a number of filter coefficients and is connected to an adjustable delay line, the method comprising:
dividing the input signal into a number of sub-band signals, where a spectrum of the input signal comprises spectra of the sub-band signals;
providing a respective goal sub-band signal for each sub-band dependent on a goal signal;
filtering and delaying each sub-band signal using a corresponding filter and delay line to provide filtered signals;
providing error signals for each sub-band dependent on the filtered signals and the corresponding goal signals;
adapting the filter coefficients of each sub-band filter in response to the error signals; and
changing a respective delay of the delay line for each sub-band in response to the error signals.

* * * * *